US008606991B2

(12) United States Patent
Sun et al.

(10) Patent No.: US 8,606,991 B2
(45) Date of Patent: Dec. 10, 2013

(54) METHOD AND SYSTEM FOR REFRESHING DYNAMIC RANDOM ACCESS MEMORY

(75) Inventors: Xu Guang Sun, Beijing (CN); Hong Wei Wang, Beijing (CN); Hou Gang Li, Beijing (CN); Kai Zhang, Beijing (CN)

(73) Assignee: International Business Machines Corporation, Armonk, NY (US)

( * ) Notice: Subject to any disclaimer, the term of this patent is extended or adjusted under 35 U.S.C. 154(b) by 420 days.

(21) Appl. No.: 12/955,112

(22) Filed: Nov. 29, 2010

(65) Prior Publication Data

US 2011/0131371 A1    Jun. 2, 2011

(30) Foreign Application Priority Data

Nov. 30, 2009    (CN) .......................... 2009 1 0225879

(51) Int. Cl.
*G06F 12/06*    (2006.01)
(52) U.S. Cl.
USPC .................................. 711/106; 711/E12.078
(58) Field of Classification Search
USPC .......................................... 711/106, E12.078
See application file for complete search history.

(56) References Cited

U.S. PATENT DOCUMENTS

| | | | |
|---|---|---|---|
| 6,954,387 B2 | 10/2005 | Kim et al. | |
| 2004/0170079 A1* | 9/2004 | Leung et al. | 365/222 |
| 2008/0074942 A1* | 3/2008 | Kobayashi | 365/230.03 |

FOREIGN PATENT DOCUMENTS

CN    1822224    8/2006

OTHER PUBLICATIONS

David Tawei Wang, "Modern DRAM Memory Systems: Performance Analysis and Scheduling Algorithm", Dissertation submitted to the Faculty of the Graduate School of the University of Maryland, College Park, 2005, pp. 1-238.

* cited by examiner

*Primary Examiner* — Yong Choe
(74) *Attorney, Agent, or Firm* — L. Jeffrey Kelly; Matthew C. Zehrer

(57) ABSTRACT

A method and system for refreshing DRAM having a plurality of banks, each of the banks including a plurality of rows includes dividing all banks in DRAM into a plurality of groups of banks, each of the groups having n banks, wherein n is an integer greater than or equal to 1. A threshold of available retention time for each group of banks is determined. Each row of banks in each group of banks is refreshed. Refreshing one row of a bank in one group of banks includes determining whether a refresh operation for the row of the bank conflicts with an access operation for the bank where the row of the bank is located. If there is a conflict, then it is determined whether to perform the refresh operation or the access operation for the current row of the bank. If it is determined to perform the access operation, the access operation is continued. If it is determined to perform the recess operation, the current row of the bank is refreshed. DRAM access performance is improved.

12 Claims, 4 Drawing Sheets

METHOD AND SYSTEM FOR REFRESHING DYNAMIC RANDOM ACCESS MEMORY

BACKGROUND OF THE INVENTION

The present invention generally relates to dynamic random access memory (DRAM), and in particular to a method for updating DRAM and a system using the same.

DRAM is a type of semiconductor memory whose principle is to represent whether a binary bit is 1 or 0 by utilizing whether an electron is stored in a capacitor. Since real capacitors leak charge, it causes insufficiency for the potential difference which makes the memory fade. This phenomenon requires the capacitor to be charged periodically on a regular basis to ensure the memory is preserved forever. Because of this character of requiring periodical refresh, it is referred to as "dynamic", as opposed to static random access memory (SRAM), in which the memory would never fade even if it is not refreshed as long as the data is stored.

Compared to SRAM, the advantage of DRAM is its structural simplicity. Only one capacitor and one transistor are required per bit to process the data, while six transistors are required per bit in SRAM. DRAM has a smaller area than SRAM under the same storage bits. DRAM also has a very high density. The higher the capacity in a cell volume lowers the cost. However, DRAM has the disadvantage of slow access speed and greater power consumption. Like most of random access memory (RAM), it is also a volatile memory device since it loses its data immediately when power is removed.

DRAM has to be refreshed in the retention time due to leakage current. When a conflict occurs between a refresh operation and a normal access operation (e.g., read or write operation), the normal access operation has to be suspended until the refresh operation is completed. DRAM is composed of a plurality of banks. Each bank includes a plurality of rows. In each clock period, one row of the banks is refreshed. Meanwhile, other banks can be accessed, but only the refreshed bank cannot be accessed. Continued access for a given bank would be interrupted by its refresh operation, particularly for a bank being continually accessed for a long time, reducing access throughput.

U.S. Pat. No. 6,954,387 B2, "DYNAMIC RANDOM ACCESS MEMORY WITH SMART REFRESH SCHEDULER", proposed a refresh method for improving the access throughput by using a flag bit register being shifted up/down. The application proposed a refresh method for a configurable DRAM. However, for the bank being continually accessed for a long time, the access throughput is still lower in above method. It is difficult to meet requirements for applications by using the existing DRAM refresh method and system with respect to some of the applications requiring a higher access throughput.

SUMMARY OF THE INVENTION

In a first aspect of the invention, a method for refreshing DRAM having a plurality of banks, each of the banks including a plurality of rows, includes dividing all banks in DRAM into a plurality of groups of banks, each of the groups having n banks, wherein n is an integer greater than or equal to 1. The method further includes determining a threshold of available retention time for each group of banks. The method also includes refreshing each row of banks in each group of banks, wherein performing a refresh for one row of a bank in one group of banks includes determining whether a refresh operation for the row of the bank conflicts with an access operation for the bank where the row of the bank is located, wherein if there is a conflict, then determining whether to perform the refresh operation or the access operation for the current row of the bank and if it is determined to perform the access operation, continuing the access operation.

In a further aspect of the invention, a system for refreshing DRAM having a plurality of banks, each of the banks including a plurality of rows, includes a global refresh sequence controller. The system also includes a refresh element sequence controller, wherein the global refresh sequence controller divides all banks in DRAM into a plurality of groups of banks, each group having n banks, wherein n is an integer greater than or equal to 1, determines a threshold of available retention time for each group of banks and controls the refresh element sequence controller to perform a refresh for each row of banks in each group of banks, wherein the refresh element sequence controller performs a refresh for each row of banks in each group of banks, wherein when performing a refresh for one row of a bank in one group of banks, the refresh element sequence controller first determines whether a refresh operation for the row of the bank conflicts with an access operation for the bank where the row of the bank is located, wherein if there is a conflict, the refresh element sequence controller then determines whether to perform the refresh operation or the access operation for the current row of the bank, and if it is determined to perform the access operation, continues the access operation.

BRIEF DESCRIPTION OF THE DRAWINGS

The present invention is described in the detailed description below, in reference to the accompanying drawings that depict non-limiting examples of exemplary embodiments of the present invention.

DETAILED DESCRIPTION OF THE INVENTION

The preferred implementation of the present invention will be described more fully with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art.

Figure 1:
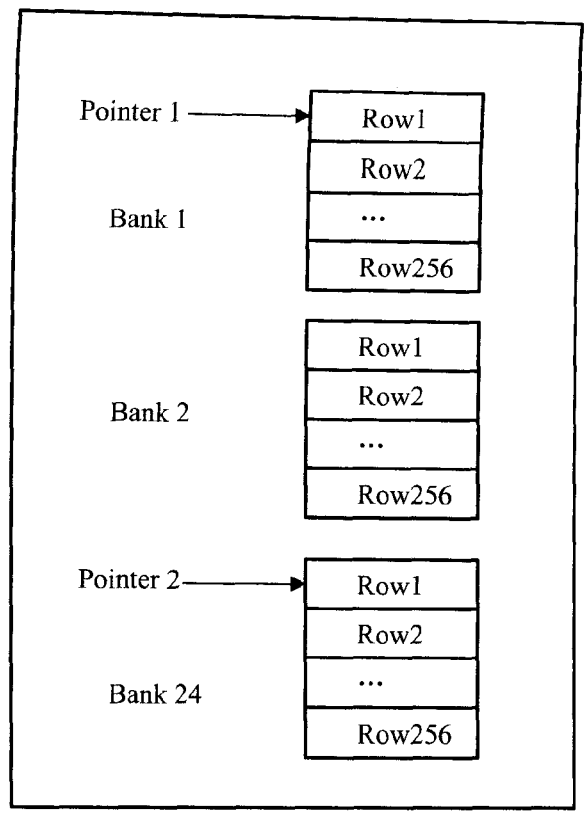
FIG. 1 schematically illustrates a method used in U.S. patent application 2005/006954387 B2, "DYNAMIC RANDOM ACCESS MEMORY WITH SMART REFRESH SCHEDULER"

FIG. 1 schematically illustrates a method used in U.S. patent application 2005/006954387 B2, "DYNAMIC RAN- DOM ACCESS MEMORY WITH SMART REFRESH SCHEDULER". The method comprises using a plurality of 24 banks, each of them having 256 rows. Due to the presence of leakage current in a capacitor, each bank should be refreshed regularly. The refresh operation must be completed during the retention time. Retention time is the time interval for each bank being refreshed. However, the refresh operation is performed in a unit of "row". Since the whole bank is unable to be accessed when one row of the bank is being refreshed, two pointers are used to indicate the rows to be refreshed. The first pointer is a primary pointer, starting from the first row of the first bank. After refreshing the row, pointer 1 points to the first row of the second bank, and then to the first row of the third bank, and so on, in an order of the number of the banks plus one, until the first rows of each bank are all refreshed. Then, the second rows of each bank are refreshed respectively, and so on. The second pointer is a secondary pointer. The second pointer starts from a $24^{th}$ bank, corresponding to the $1^{st}$ row, $2^{nd}$ row, $3^{rd}$ row, ..., of each bank in turn, in an order of the number of the banks minus one. When a row to be refreshed pointed to by pointer 1 is performing an access operation, a row pointed to by pointer 2 is refreshed, and then pointer 2 is updated. By doing so, the conflict between the refresh operation and the access operation could be avoided. When a row pointed to by pointer 1 must be refreshed due to the restriction of retention time, while the row is to be accessed, the access operation is suspended, proceeding until the refresh operation is completed.

For example, a total retention time for all banks of DRAM is 36 us (microseconds). If a clock cycle is 5 ns (nanoseconds), then a minimum refresh time for a row of all banks is conservatively calculated as: the retention time of the banks/(the row number of a bank+1)=36 us/(256+1)=140 ns (i.e., 28 clock cycles). Therefore, a maximum refresh time interval for a row of all banks is 140 ns or 28 clock cycles. One row could be refreshed every clock cycle. If the first row of bank 1 is just continually accessed, such that it can not be refreshed, then at this time, pointer 2 points to the first row of bank 24 so as to perform refresh. The, pointer 2 points to the first row of bank 23 for performing refresh, ..., until pointer 2 points to the first row of bank 2 for performing refresh. The first row of bank 1 is still able to be accessed since the time when the first row of bank 1 must be refreshed is not reached yet. At this time, the refresh operation could be suspended at most for 4 clock cycles. Upon the fifth clock cycle, the first row of bank 1 must stop the access operation, and refresh operation is performed. Otherwise, the stored data cannot be retained due to leakage current. That is, the maximum continued access time for a certain row of data is 5 ns*(28−1)=135 ns. Similarly, if the first row of each bank is all refreshed, until the first row of bank 23 is refreshed completely, the method is supposed to start refreshing the first row of bank 24, but bank 24 is performing a continued access operation, at this time temporarily stopping the refresh operation at most for 4 clock cycles. Upon the fifth clock cycle, bank 24 must stop access operation, and refresh operation is performed. Otherwise, the stored data cannot be retained due to leakage current. That is, the minimum continued access time for a certain row of data is 5 ns*(28−24)=20 ns. Thus, in the case where a conflict occurs between refresh and access, the continued access time for a certain row of the bank is among [20 ns, 135 ns]. One reason why continued access time for a bank is not very long is that the rows of banks must be refreshed for 28 clock cycles. If the time to be refreshed is extended, then the continued access time could be extended.

Figure 2:
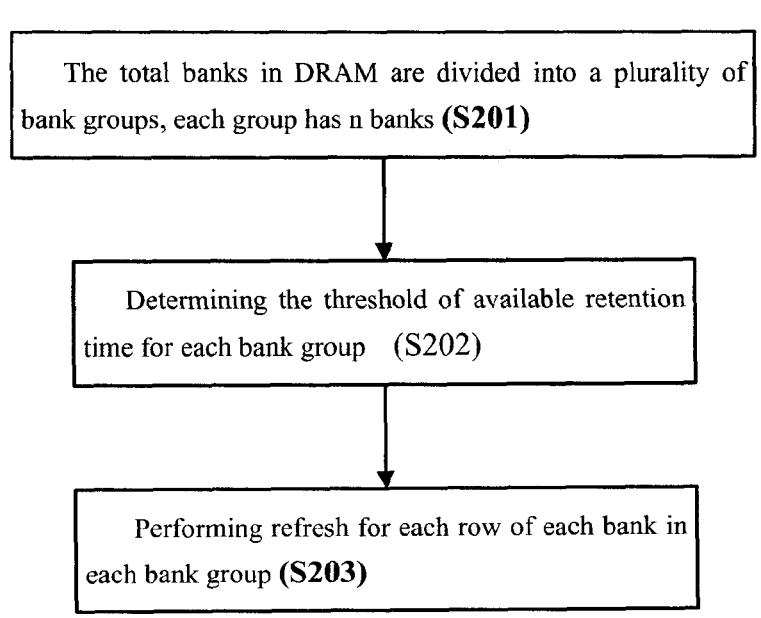
FIG. 2 schematically illustrates a flowchart of a method for refreshing the banks in DRAM according to an embodiment of the invention.

FIG. 2 schematically illustrates a flowchart of a method for refreshing the banks in DRAM according to an embodiment of the invention. In step S201, all banks in DRAM are divided into a plurality of bank groups. Each group has n banks, wherein n is an integer greater than or equal to 1. In step S202, a threshold of available retention time for each group of banks is determined. In step S203, refresh is performed for each row of each bank in each group of banks. Performing a refresh for one row of a bank in one group of banks includes determining whether the refresh operation for the row of the bank is conflicting with the access operation for the bank where the row of the bank is located. If yes, then it is determined whether to perform a refresh operation or an access operation for the current row of bank. If it is determined to perform an access operation, then it continues the access operation.

Figure 3:
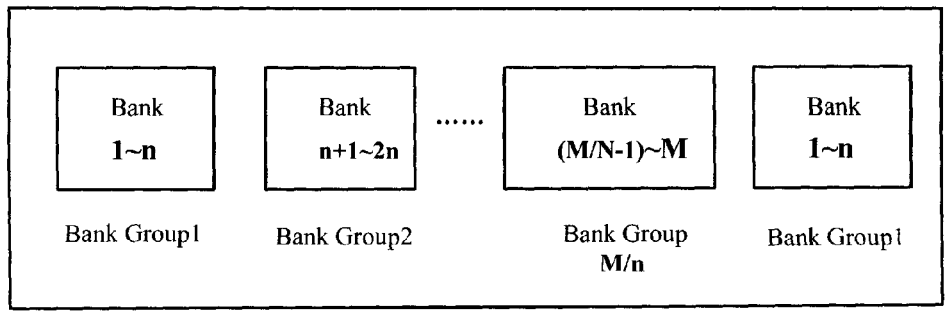
FIG. 3 schematically illustrates a schematic diagram of grouping the banks in DRAM according to an embodiment of the invention.

FIG. 3 schematically illustrates a schematic diagram of grouping the banks in DRAM according to an embodiment of the invention for step S201. DRAM includes M banks in total. If the number of each group of banks is n, where n is an integer greater than 0, it is divided into M/n bank groups. As for step S202, if the average total retention time of DRAM is determined for each group of banks, then the determined available retention time for each group of banks is (the total retention time/(M/n)). Herein for safety and after taking a conservative manner, it has been determined that the threshold of available retention time for each group of banks is (the total retention time/(M/n+k)), where k is an integer greater than or equal to 1, and preferably, k=1. As k increases, the allocated threshold of available retention time decreases, reducing the continued access time.

As for refreshing each bank in each group of banks in step S203, according to the above grouping condition, if there are m rows in each bank, then there are m*n rows in each group of banks. When performing a refresh for a row among the m*n rows, performing a refresh for one row of banks in one group of banks includes determining whether the refresh operation for the row of the bank is conflicting with the access operation for the bank where the row of the bank is located. If yes, then it is determined whether to perform a refresh operation or an access operation for the current row of banks. If it is determined to perform an access operation, then it continues the access operation. Preferably, when a conflict occurs, determining whether to perform a refresh operation or an access operation for the current row is based on the determined threshold of available retention time, as well as the group refresh time. Herein, group refresh time is a time difference from the start of refresh until current refresh for the bank group. If the group refresh time is far less than the determined threshold of available retention time for the bank group, then the remaining time is still enough with respect to the rows not yet being refreshed. The bank continues the access operation instead of starting the refresh operation. If time is relatively tight, that is, if a difference between the difference between allocated threshold of available retention time for the bank group and the group refresh time, and required all refresh time for those rows to be refreshed in the bank group is less than a set threshold, then the bank performs the refresh operation. Here, the threshold could be set according to the characteristics of DRAM itself and the complexity for control. For example, if the control time is longer, then the set threshold is better above 0. Otherwise, just a very small set threshold is enough.

Figure 4:
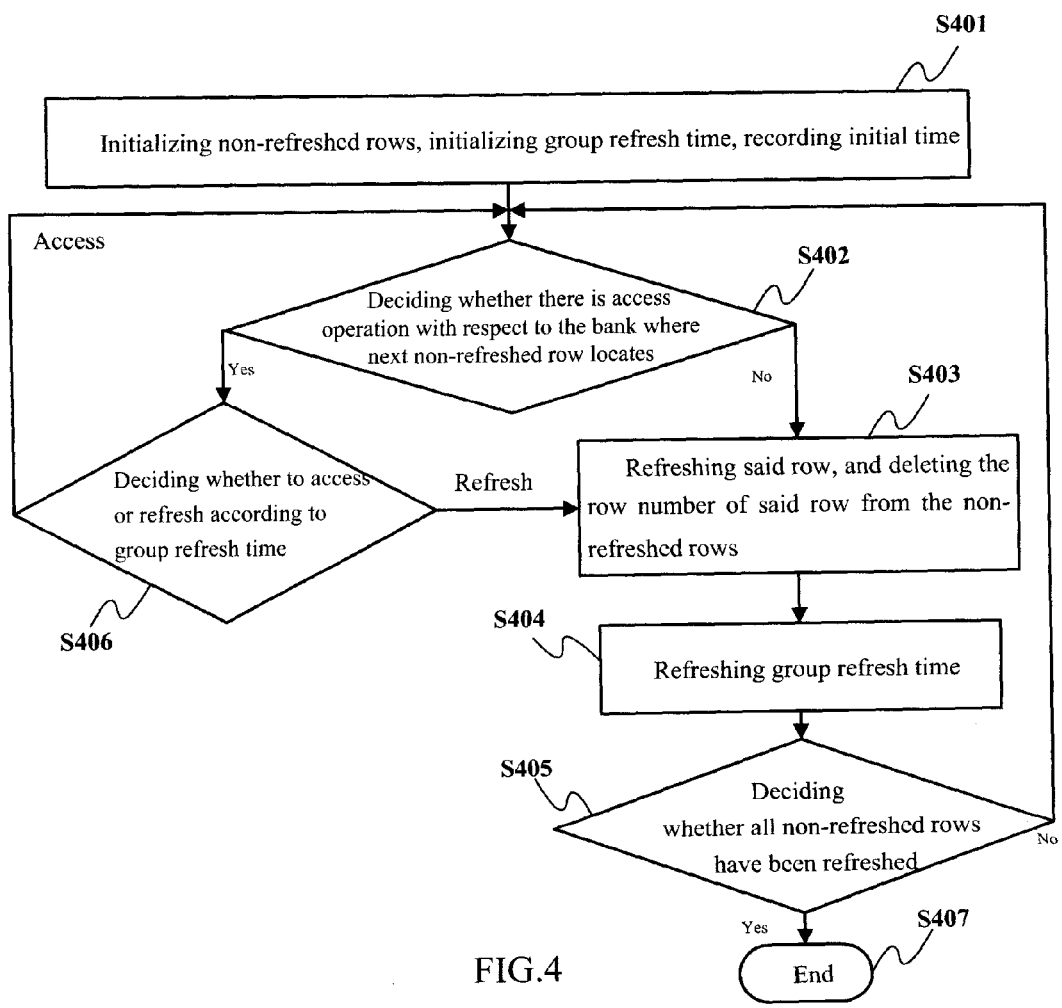
FIG. 4 illustrates one implementation of a refresh process for a group of banks according to an embodiment of the invention.

In particular, FIG. 4 illustrates one implementation of a refresh process for a group of banks according to an embodiment of the invention. In step S401, initializing non-refreshed rows, initializing group refresh time and recording current time as initial time are performed. All rows in one bank group are numbered with a row number, wherein a data structure such as array table could be used to record the row numbers for all non-refreshed rows. If a row finishes its refresh, then the row number of the row is deleted from the data structure. Otherwise, the row number is still kept in the data structure. The group refresh time is a time difference from the start of refresh until current refresh for the bank group, which could be obtained by using the current time minus the initial time in the refresh process. In step S402, regarding the next non-refreshed row, it is determined whether there is an access operation with respect to the bank where the row is located. In step S403, if there is no access operation for the row, the row is refreshed, and the row number of the row is deleted from the non-refreshed rows. Then, in step S404, group refresh time is refreshed. In step S405, it is determined whether all non-refreshed rows have been refreshed. If yes, then the process is ended in step S407. Otherwise, it returns to step S402 and continues determining the next non-refreshed row. In step S405, if there is an access operation with respect to the bank where the row is located, then it is determined whether to perform a refresh operation or an access operation for the current row, according to determined threshold value of available retention time for the bank group, the group refresh time, and the row numbers of the remaining non-refreshed banks. For example, the aforementioned DRAM retention time as 36 us is used, where n=2, then it is determined that the available retention time for each bank is 3000 ns. Each bank group has 256*2 rows and one clock cycle is 5 ns. The total refresh time for each row is 256*2*5=2560 ns<3000 ns. Obviously, the group refresh time has a margin with respect to the determined threshold of available retention time for the bank group. As for a certain row, discovering the access operation for the row, at this time, in step S406, determines if there is still enough time to refresh the bank group. In other words, if the row numbers of non-refreshed rows multiplies the refresh time of each row plus the group refresh time does not reach the threshold of available retention time for the bank group, the row may not have been refreshed firstly. It makes the bank where the row is located continue its access operation. Then, it chooses the access operation, at this time, and returns back to step S402, to continue the determination for the next non-refreshed row, because it is possible that the next non-refreshed row and the current row might occur in one bank. Then, it continues determining the next non-refreshed row, until a non-refreshed row at next bank. In step S406, if the row is not refreshed, it will cause the group refresh time of the whole bank group to exceed the determined threshold of available retention time for the bank group. Then, then it goes to step S403, to refresh the row. After that, in step S404, the group refresh time is updated. In step S405, it is determined whether all non-refreshed rows have been refreshed, until all rows of the bank group have been refreshed. In this embodiment, there is only one pointer to the row to be refreshed. Currently, the efficiency is low when there is a conflict between access and refresh; however, it could still increase the continued access time for a bank significantly.

Figure 5:
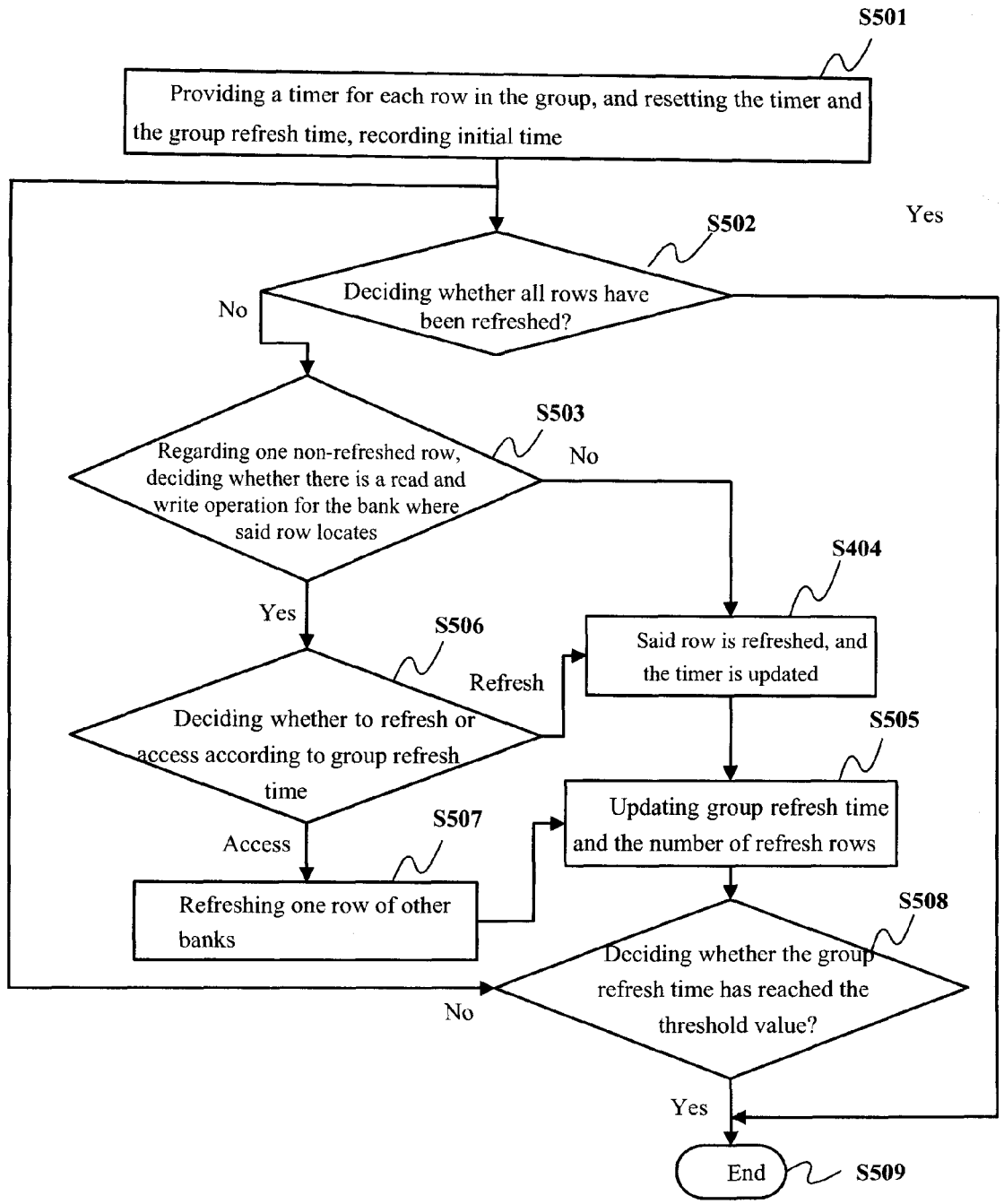
FIG. 5 illustrates another implementation of a refresh process for a group of banks according to an embodiment of the invention.

FIG. 5 illustrates another implementation of a refresh process for a group of banks according to an embodiment of the invention. In step S501, each row among the group is provided with a timer which is reset, and the group refresh time is also reset. The timer could be used to record the times of the current row being refreshed. Group refresh time is used to accumulate a time difference from the start of refresh until current refresh for the bank group. Initial time is recorded. In step S502, it is determined whether all rows have been refreshed. It could be determined according to the times of the current row being refreshed recorded in the timer. If yes, then the refresh process is stopped in step S509. Otherwise, in step S503, regarding one non-refreshed row, it is determined whether there is a read and write operation for the bank where the row is located. If not, then the row is refreshed in step S504 and the refresh times of the refresh timer for the row is updated. In step S505, group refresh time and the number of rows to be refreshed are updated. The group refresh time could be obtained by using the current time minus the initial time. The number of rows to be refreshed is the total number of rows to be refreshed from the start of refreshing for the bank group until the present. Afterward in step S508, it is determined whether the group refresh time has reached the threshold of available retention time determined for the bank group. If it has reached the threshold of available retention time determined for the bank group, then the process is stopped in step S509. Otherwise, it goes back to step S502, to continue determining whether all rows have been refreshed. In step S503, if it is determined that there is a read and write operation for the bank where the row is located, then in step S506, it is determined whether to perform refresh operation or access operation for the current row. The decision could be made according to determined threshold value of available retention time for the bank group, the group refresh time, and the row numbers of the banks being refreshed, or according to similar variation. As for the bank group, if there is still enough time to refresh, in other words, if the row numbers of non-refreshed rows multiplies the refresh time of each row plus the group refresh time does not reach the threshold of available retention time for the bank group, the row may not been refreshed firstly. It makes the bank where the row is located continue its access operation, and then it chooses access operation. In the access operation of the present embodiment, it is going to refresh one row of other banks in step S507, such that there is no longer a conflict. It could select other banks and other rows using a different strategy. For example, a balanced allocation strategy, namely choosing the bank with the least number of rows being refreshed among the bank group as the refresh bank of this time. Thereafter, it returns to step S505, to update group refresh time and the number of rows to be refreshed, and it continues the determination of step S508, or it goes back to the determination of step S502 (not shown), until all rows have been refreshed. In the present embodiment, the efficiency is even higher due to the flexible selection for the banks to be refreshed. It is highly possible that the refresh of the bank group is finished during a time far less than the determined threshold value of available retention time for the bank group. In particular the methods of FIG. 4 and FIG. 5 of present invention may be combined. For example, the method of FIG. 5 could use the cycling method of FIG. 4 instead of using the timer. All of these combinations fall within the scope of the present invention.

Table 1 shows a comparison of continued access time for banks between the method provided in an embodiment of the present invention and U.S. patent application 2005/006954387 B2 (unit: ns). The following parameters are used in Table 1: a total retention time for all banks of DRAM is 36 us; DRAM includes 24 banks, each of them having 256 rows; and a clock cycle is 5 ns. As shown in Table 1, the method provided in an embodiment of the present invention has greatly improved the continued access time for banks.

TABLE 1

| | Present invention | | U.S. patent application 2005/006954387 B2 | |
|---|---|---|---|---|
| N | Maximum time | Minimum time | Maximum time | Minimum time |
| 1 | 32 | 32 | 27 | 4 |
| 2 | 296 | 40 | | |
| 3 | 542 | 30 | | |
| 4 | 772 | 4 | | |

In one preferred implementation, when the refresh element sequence controller performs a refresh for one row of a bank in one group of banks, if the determined result by the refresh element sequence controller is a refresh operation, then the row of the bank is refreshed. The determination for refresh operation and access operation could be made according to the following manner: if a difference between the difference between allocated threshold of available retention time for the bank group and the group refresh time, and required all refresh time for those non-refreshed rows in the bank group is less than a set threshold, then the bank performs the refresh operation, wherein, group refresh time is a time difference from the start of refresh until current refresh for the bank group. Those skilled in the art would appreciate that the determination could also be made based on a variant of the above manner.

In another preferred implementation, the continuous access operation of the refresh element sequence controller could be configured as: maintaining the access operation for the bank where the row of bank is located, not performing refresh for the row of the bank; determining whether to perform a refresh operation or an access operation for the next non-refreshed row of the bank.

In a further preferred implementation, the continuous access operation of the refresh element sequence controller could be further configured for performing refresh operation for rows of the bank which is not in the bank where the row of bank is located; and then deciding whether to perform a refresh operation or an access operation for the next non-refreshed row of the bank.

Figure 6:
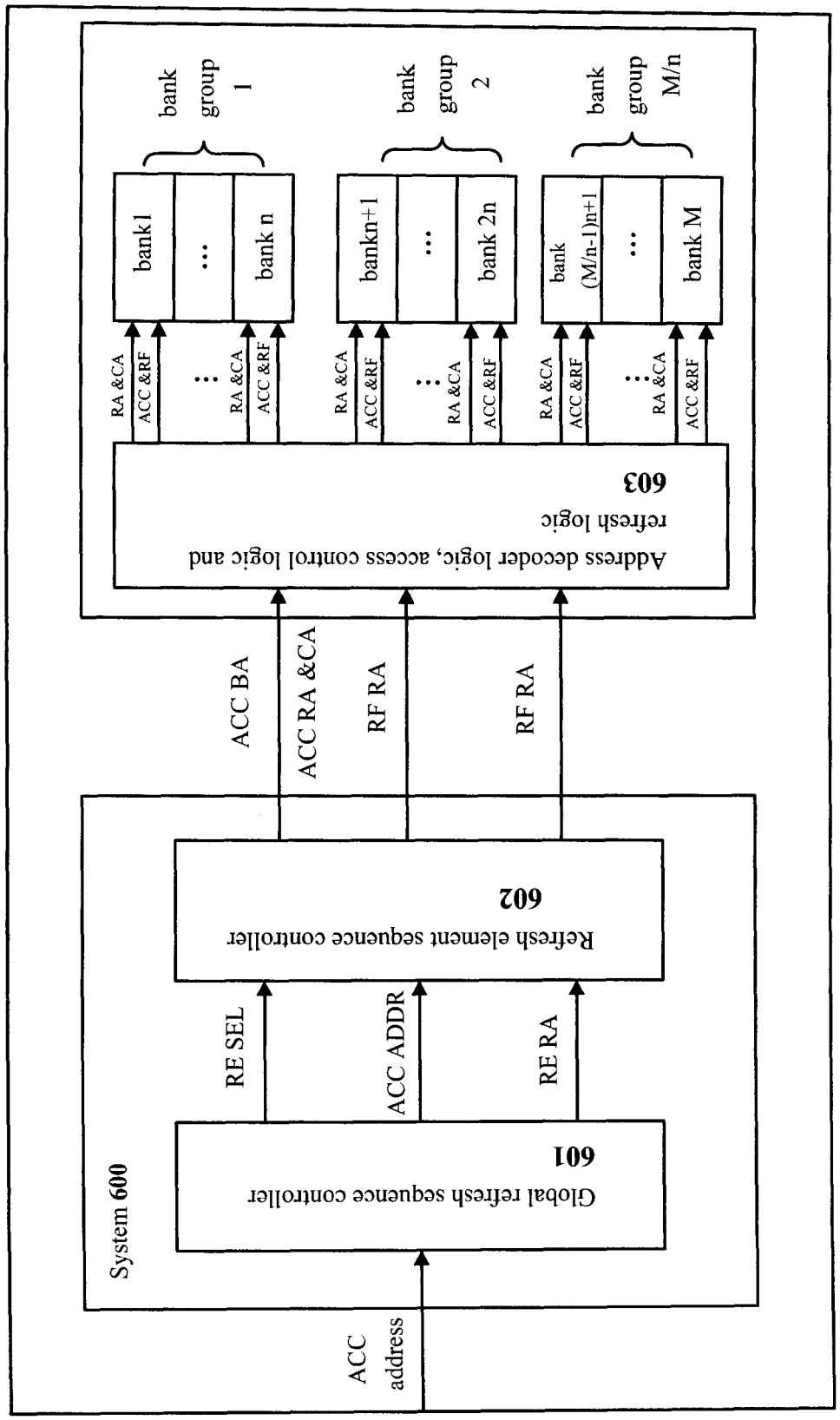
FIG. 6 illustrates a connection relationship between a system for refreshing the banks in DRAM and the banks according to an embodiment of the invention.

FIG. 6 illustrates a connection relationship between a system for refreshing the banks in DRAM and the banks according to an embodiment of the present invention. System 600 could be made into a separate chip, or could be made into a DRAM chip combining the banks as one body. System 600 includes a global refresh sequence controller 601 and a refresh element sequence controller 602. Refresh element sequence controller 602 controls the refresh of the row of the banks for the bank group through address decoder logic, access control logic and refresh logic 603. The global refresh sequence controller 601 could receive configuration parameters (for example, parameter n, the total retention time of DRAM, etc.) by way of hardware or software. Parameter n could be chosen in accordance with the actual situation of read and write access. The total retention time of DRAM is mainly decided by the process of the chip and current temperature. A temperature inside the chip could provide temperature information in real time. These two parameters support a dynamic configuration so as to improve the performance of read and write access and reduce the power consumption of the chip. The total retention time of DRAM is very sensitive to temperature. The total retention time increases when the chip temperature is low. At this time, if the parameter of the total retention time of DRAM is reconfigured, then the refresh frequency of DRAM will be reduced, which may not only improve the performance of continuous read and write access, but also reduce the power consumption of the chip. Likewise, the greater the value of n, the better the performance of continuous read and write access. However it also means the higher the refresh frequency of DRAM, the greater the power consumption. A reasonable choice may be made according to the characteristics of the current read and write access.

As shown in FIG. 6, the global refresh sequence controller 601 notifies refresh element sequence controller 602 of the bank group currently selected, through a Refresh Element Selection signal (RE SEL). Meanwhile, it also transfers the read and write Access Address (ACC ADDR) to the refresh element sequence controller 602. Preferably, the global refresh sequence controller 601 could also receive a Refresh Element Feed Back (RE FB) (not shown) from refresh element sequence controller 602 to readjust the refresh time corresponding to the next refresh element.

Refresh element sequence controller 602 selects which bank group to be refreshed according to the Refresh Element Selection signal (RE SEL) and decides whether the current read and write access will continue or suspend according to the conflict situation between the current refresh operation and the read and write access operation. Refresh element sequence controller 602 outputs a Refresh Bank Address signal (RF BA) and Refresh Row Address signal (RF RA). At the same time, refresh element sequence controller 602 further outputs an active read and write Access Bank Address signal (ACC BA), Access Row Address signal (ACC RA) and Access Column Address signal (ACC CA). These address signals would be transferred to the banks of DRAM. Refresh element sequence controller 602 adopts the method of the present invention to control how to refresh each row in a refresh element. In general, the decoder and control logic in DRAM memory will decode the address signals outputted from refresh element sequence controller 602, to generate Row Address signal (RA), Column Address signal (CR), and Access or Refresh control signal (ACC and RF).

Although the exemplary embodiments of the present invention have been described with reference to the attached drawings herein, it should be understood that the present invention is not limited to those particular embodiments. Those skilled in the art could make variations and modifications to the embodiments without departing from the spirit and scope of the present invention. All of these variations and modifications are intended to be included in the scope and spirit of the present invention.

According to the above description, those skilled in the art should appreciate that the present invention may be embodied as devices, methods or computer program products. Accordingly, the present invention may be embodied in the following forms, that is, may be entirely hardware, entirely software (including firmware, resident software, microcode, etc.), or combinations of software components and hardware components, which are generally referred to herein as "circuit", "module" or "system". In addition, the present invention may also adopt a form of computer program product embodied in any tangible medium of expression having computer usable program code embodied in the medium.

Any combinations of one or more computer-usable or computer-readable medium could be used. The computer-usable or computer-readable medium may be, for example, but not limited to, electronic, magnetic, optical, electromagnetic, infrared, or semiconductor system, apparatus, device or propagation medium. More specific examples (non-exhaustive list) of computer-readable medium include the following: electrical connection with one or more of wires, portable computer disks, hard disks, Random-access memory (RAM), Read-only memory (ROM), Erasable Programmable Read-only memory (EPROM or Flash memory), optical fiber, a portable compact disk read-only memory (CD-ROM), optical storage devices, transmission medium, such as supporting Internet or Intranet, or magnetic storage devices. The computer-usable or computer-readable medium could even be paper or another suitable medium upon which the program is printed, as the program can be electronically captured, via, for instance, electrical scanning of the paper or other medium, then compiled, interpreted, or processed in a suitable manner, and stored in the computer memory if necessary. A computer-usable or computer-readable medium may be any medium that can contain, store, communicate, propagate, or transport the program for use by or in connection with the instruction execution system, apparatus, or device. The computer-usable medium may be included in a base band or in a data signal, in which the computer-usable program code is embedded, propagated as a part of carrier waves. The computer-usable program code can be transmitted using any suitable medium, including, but not limited to, wireless, cable, optical fiber, RF, and the like.

Computer program code for carrying out operations of embodiments of the present invention may be written in any combination of one or more programming languages, including an object oriented programming language such as Java, Smalltalk, C++ or the like and conventional procedural programming languages, such as the "C" programming language or similar programming languages. The program code may execute entirely on a user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN), or a wide area network (WAN), or the connection may be made to an external computer (for example, through the Internet using an Internet Service Provider).

In addition, each block of the flowchart and/or block diagram of the present invention and the combinations of respective blocks of the flowchart and/or block diagram, can both implemented by computer program instructions. These computer program instructions may be provided to a general purpose computer, special purpose computer or processors of other programmable data processing devices, thereby producing a machine, which is enabled to produce means for implementing the functions/operations specified by the blocks of flowchart and/or block diagram through these instructions executed by computers or other programmable data processing devices.

These computer instructions could also be stored in a computer-readable medium which can instruct the computers or other programmable data processing devices to operate in a particular manner. In this way, instructions stored in the computer-readable medium produce a manufacture comprising the instruction means implementing the functions/operations specified by the blocks of flowchart and/or block diagram.

These computer instructions could also be loaded into computers or other programmable data processing devices, to execute a series of operation steps on computers or other programmable data processing devices, so as to generate a process implemented by the computer. Thus, instructions executed in computers or other programmable data processing devices can provide the process implementing the functions/operations specified by the blocks of flowchart and/or block diagram.

Flowcharts and block diagrams in the attached drawings illustrate the system, method and possible implemented system architecture, function and operation of the computer program product according to various embodiments of the present invention. Each block of the flowcharts or block diagrams may represent one modular, program segment, or a part of code, which includes one or more executable instructions used to implement specified logic function. It should be noted that, in some implementations as replacements, the functions depicted in the blocks may also occur in an order different than that depicted in the attached drawings. For example, two blocks consecutively shown can be performed substantially in parallel or sometimes they can be performed in an opposite order, which is decided depending on related function. It should be also noted that, each block of the flowchart and/or block diagram and the combinations of blocks of the flowchart and/or block diagram, can be achieved by using a specific hardware-based system executing specified functions or operations, or achieved by using a combination of specific hardware and computer instructions.

The invention claimed is:

1. A method for refreshing dynamic random access memory (DRAM) having a plurality of banks, each of the banks including a plurality of rows, comprising:
   dividing all banks in DRAM into a plurality of groups of banks, each of the groups having n banks, wherein n is an integer greater than or equal to 1;
   determining a threshold of available retention time for each group of banks; and
   refreshing each row of banks in each group of banks, wherein performing a refresh for one row of a bank in one group of banks includes:
   determining whether a refresh operation for the row of the bank conflicts with an access operation for the bank where the row of the bank is located, wherein if there is a conflict, then determining whether to perform the refresh operation or the access operation for the current row of the bank; and
   if it is determined to perform the access operation, continuing the access operation,
   wherein determining whether to perform the refresh operation or the access operation for the current row of the bank includes performing the refresh operation if a difference between, a difference between the threshold of available retention time for a bank group and a group refresh time, and all required refresh time for non-refreshed rows in the bank group is less than a set threshold, wherein the group refresh time is a time difference from a start of refresh until current refresh for the bank group.

2. The method according to claim 1, wherein if it is determined to perform the refresh operation, then the current row of the bank is refreshed.

3. The method according to claim 1, wherein continuing the access operation includes maintaining the access operation for the bank where the row of the bank is located, instead of performing the refresh operation for the row of the bank.

4. The method according to claim 3, wherein continuing the access operation further includes performing the refresh operation for other rows of the bank of other banks in the one group of banks.

5. The method according to claim 1, wherein the row of the bank is refreshed if it is determined that the refresh operation for the row of the bank does not conflict with the access operation for the bank where the row of the bank is located.

6. A system for refreshing dynamic random access memory (DRAM) having a plurality of banks, each of the banks including a plurality of rows, comprising:
   a global refresh sequence controller; and
   a refresh element sequence controller, wherein the global refresh sequence controller divides all banks in DRAM into a plurality of groups of banks, each group having n banks, wherein n is an integer greater than or equal to 1, determines a threshold of available retention time for each group of banks and controls the refresh element sequence controller to perform a refresh for each row of banks in each group of banks, wherein the refresh element sequence controller performs a refresh for each row of banks in each group of banks, wherein when performing a refresh for one row of a bank in one group of banks, the refresh element sequence controller first determines whether a refresh operation for the row of the bank conflicts with an access operation for the bank where the row of the bank is located, wherein if there is a conflict, the refresh element sequence controller then determines whether to perform the refresh operation or the access operation for the current row of the bank, and if it is determined to perform the access operation, continues the access operation, wherein determining by the refresh element sequence controller whether to perform the refresh operation or the access operation for the current row of the bank includes performing the refresh operation if a difference between, a difference between the threshold of available retention time for a bank group and a group refresh time, and all required refresh time for non-refreshed rows in the bank group is less than a set threshold, wherein the group refresh time is a time difference from a start of refresh until current refresh for the bank group.

7. The system according to claim 6, wherein if a determined result of the refresh element sequence controller is to perform the refresh operation, then the current row of the bank is refreshed.

8. The system according to claim 7, wherein the refresh element sequence controller is configured to refresh the row of the bank if it is determined that the refresh operation for the row of the bank is not conflicting with the access operation for the bank where the row of the bank is located.

9. The system according to claim 7, wherein the determined threshold of available retention time for each group of banks is (a total retention time of DRAM)/(M/n+k), wherein M is the total number of banks in DRAM, n is the number of banks in a group of banks, M/n is the number of groups of banks in DRAM, and k is an integer greater than or equal to 1.

10. The system according to claim 6, wherein a continuous access operation of the refresh element sequence controller is configured to maintain the access operation for the bank where the row of the bank is located, instead of performing the refresh operation for the row of the bank.

11. The system according to claim 10, wherein the refresh element sequence controller is further configured to perform the refresh operation for other rows of the bank of other banks in the one group of banks.

12. A method for refreshing dynamic random access memory (DRAM) having a plurality of banks, each of the banks including a plurality of rows, comprising:

dividing all banks in DRAM into a plurality of groups of banks, each of the groups having n banks, wherein n is an integer greater than or equal to 1;

determining a threshold of available retention time for each group of banks; and refreshing each row of banks in each group of banks, wherein performing a refresh for one row of a bank in one group of banks includes:

determining whether a refresh operation for the row of the bank conflicts with an access operation for the bank where the row of the bank is located, wherein if there is a conflict, then determining whether to perform the refresh operation or the access operation for the current row of the bank; and if it is determined to perform the access operation, continuing the access operation, wherein the determined threshold of available retention time for each group of banks is (a total retention time of DRAM)/(M/n+k), wherein M is the total number of banks in DRAM, n is the number of banks in a group of banks, M/n is the number of groups of banks in DRAM, and k is an integer greater than or equal to 1.

* * * * *